United States Patent
Okuno et al.

(10) Patent No.: US 7,501,686 B2
(45) Date of Patent: Mar. 10, 2009

(54) SEMICONDUCTOR DEVICE AND METHOD FOR MANUFACTURING THE SAME

(75) Inventors: Masaki Okuno, Kawasaki (JP);
Sadahiro Kishii, Kawasaki (JP);
Hiroshi Morioka, Kawasaki (JP);
Masanori Terahara, Kawasaki (JP);
Shigeo Satoh, Kawasaki (JP); Kaina Suzuki, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 14 days.

(21) Appl. No.: 11/358,317

(22) Filed: Feb. 22, 2006

(65) Prior Publication Data

US 2006/0281245 A1 Dec. 14, 2006

(30) Foreign Application Priority Data

Jun. 10, 2005 (JP) ............................. 2005-171277
Nov. 16, 2005 (JP) ............................. 2005-331700

(51) Int. Cl.
*H01L 29/00* (2006.01)

(52) U.S. Cl. ............... 257/369; 257/510; 257/E21.546; 257/E29.02; 438/221; 438/296; 438/437; 438/700

(58) Field of Classification Search ................ 257/369, 257/371, 510, E21.546, E29.02; 438/221, 438/296, 424, 435–437, 700
See application file for complete search history.

(56) References Cited

U.S. PATENT DOCUMENTS 5,498,566 A * 3/1996 Lee ........................... 438/425

FOREIGN PATENT DOCUMENTS

| JP | 63-151047 | 6/1988 |
|----|-----------|--------|
| JP | 02-248047 A | 10/1990 |
| JP | 2002-43413 | 2/2002 |
| JP | 2002-270684 | 9/2002 |
| JP | 2003-158241 | 5/2003 |
| JP | 2003-273206 | 9/2003 |

OTHER PUBLICATIONS

Taiwanese Office Action dated May 30, 2008 issued in corresponding Application No. 95105924.

* cited by examiner

*Primary Examiner*—M. Wilczewski
*Assistant Examiner*—Toniae M. Thomas
(74) *Attorney, Agent, or Firm*—Westerman, Hattori, Daniels & Adrian, LLP.

(57) ABSTRACT

A semiconductor device is disclosed that includes a semiconductor substrate, a device region disposed at a predetermined location of the semiconductor substrate, and a shallow trench isolation region that isolates the device region. The shallow trench isolation region includes a trench, a nitride film liner disposed at an upper portion of a side wall of the trench, and a thermal oxide film disposed at a lower portion of the side wall of the trench. The shallow trench isolation is arranged such that the width of a second portion of the shallow trench isolation region at which the thermal oxide film is disposed may be wider than the width of a first portion of the shallow trench isolation region at which the lower end of the nitride film liner is disposed.

19 Claims, 16 Drawing Sheets

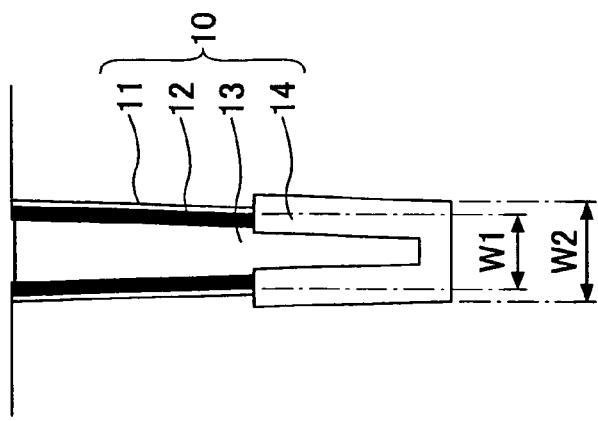
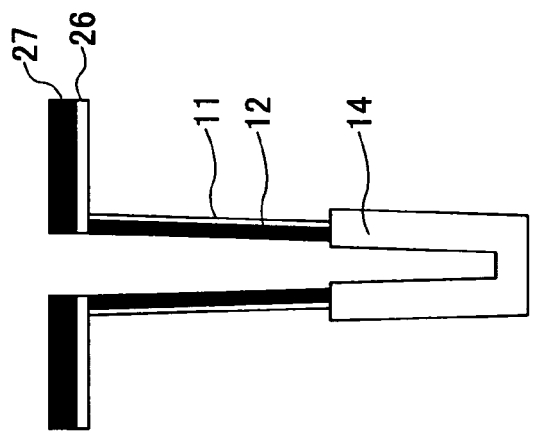
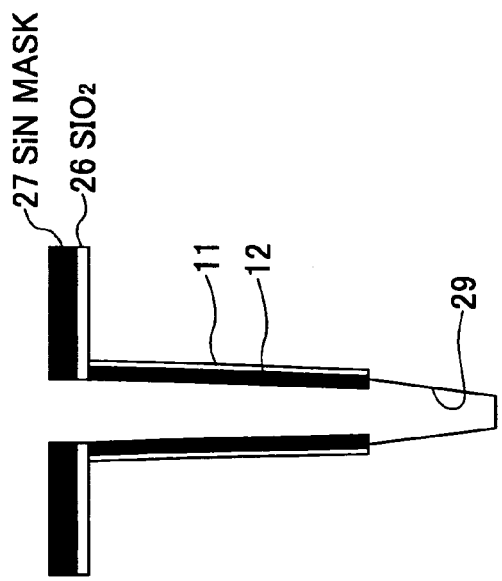

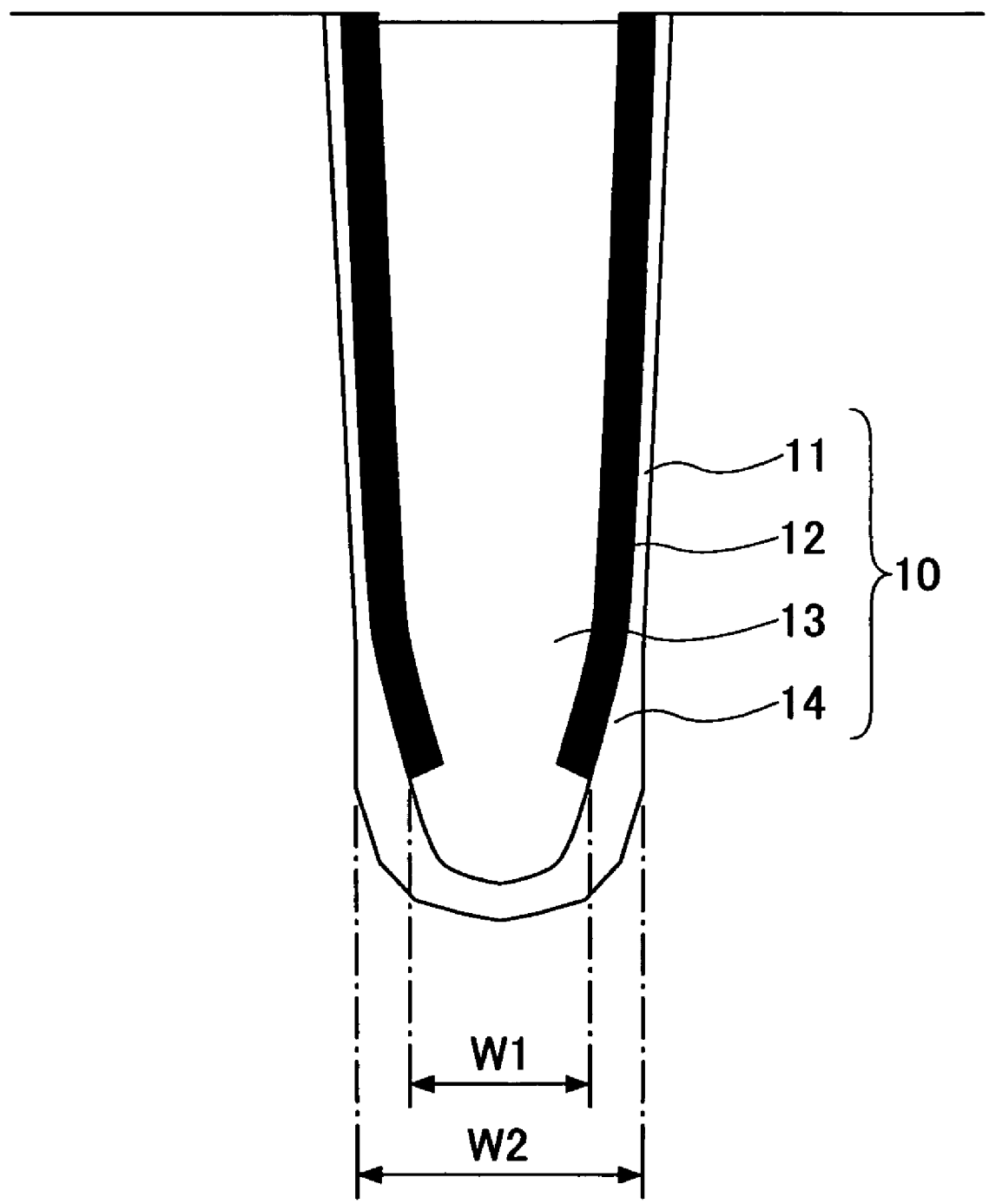

SEMICONDUCTOR DEVICE AND METHOD FOR MANUFACTURING THE SAME

BACKGROUND OF THE INVENTION

1. Field of the Invention

The present invention relates generally to a semiconductor device and a manufacturing method thereof, and particularly to a CMOS semiconductor device having a STI (Shallow Trench Isolation).

2. Description of the Related Art

In developing STI technology for a CMOS semiconductor device, there are two main objects to be addressed in conjunction with miniaturization of semiconductor device elements. One is suppressing interwell leakage, and the other is controlling stress generated from the STI that is applied to the active region.

In the following, the interwell leak current generated between a p-well and an n-well is described. As is shown in FIG. 1, for example, in a case where a drain voltage is applied to an n-type drain of an NMOS device, the interwell leak current refers to the leak current that flows from the n-type drain of this NMOS device via a STI to an n-well of a PMOS device adjacent to this NMOS device. With the miniaturization of the semiconductor device, the leak current may increase owing to the reduction in length of the leak path through which the leak current flows.

In response to such a problem, techniques are disclosed that involve enlarging the bottom portion of the STI in order to extend the leak path so that leak current generation may be suppressed (e.g., see Japanese Laid-Open Patent Publication No. 2002-270684 and Japanese Laid-Open Patent Publication No. 2002-43413). However, the disclosed techniques do not address the other object, namely, controlling the stress generated from the STI upon miniaturization of semiconductor device elements.

The other object to be addressed in developing STI technology is controlling the stress generated from the STI. Compressive stress from STI implant material reduces mobility particularly in an NMOS semiconductor, and thereby, a nitride film that generates tensile stress is often used as a liner film at the STI side wall in order to reduce the compressive stress from the STI (e.g., see Japanese Laid-Open Patent Publication No. 2003-273206).

FIG. 2 is a diagram illustrating an exemplary STI structure having a nitride film liner. In FIG. 2, the inner wall of a trench formed through anisotropic dry etching, for example, is lined with a nitride film liner 101, and an oxide film 102 is employed to fill in the trench covered by the nitride film liner 101 to realize a STI 110. In this example, tensile stress is applied to the channel region so that the decrease in mobility may be alleviated.

Also, it is noted that tensile stress in the channel direction is preferably applied to improve mobility of the NMOS semiconductor. Accordingly, a structure is disclosed in which an oxidation preventive film made of nitride material, for example, is formed on the STI side wall adjacent to a NMOS whereas the STI side wall adjacent to an PMOS does not have the oxidation preventive film formed thereon (e.g., see Japanese Laid-Open Patent Publication No. 2003-158241).

SUMMARY OF THE INVENTION

The present invention may provide a semiconductor device and a manufacturing method thereof for solving the problems relating to device isolation that arise with miniaturization of the CMOS semiconductor device. Namely, an embodiment of the present invention provides a semiconductor device and a manufacturing method thereof for suppressing P-N interwell leak current generation while controlling stress generated from the STI.

It is noted that the inventors of the present invention recognize that the increase in the amount of interwell leak current due to well exposure positioning deviation cannot be ignored as miniaturization of device structures progresses. This problem becomes particularly prominent as the extent of exposure positioning deviation in well implantation becomes greater than or equal to the STI width. As is shown in FIG. 3, when exposure positioning deviation occurs upon well implantation and the boundary 125 between the p-well and the n-well is deviated from the bottom portion of the STI 110 to be positioned against the STI side wall, the distance d between the n-type drain 22 and the boundary 125 is reduced to thereby cause a substantial increase in drain current generation.

In order to prevent such an effect, the bottom portion of the STI has to be enlarged to have a width that is at least equal to the well exposure positioning deviation margin width while controlling the stress generated from the STI at the same time.

Accordingly, a preferred embodiment of the present invention provides a semiconductor device including a STI with a stress controlling liner nitride film and a modified bottom portion structure for realizing improved inter-device pressure resistance characteristics. An embodiment of the present invention also provides a method for manufacturing such a semiconductor device.

According to one embodiment of the present invention, a nitride film liner is arranged at the upper portion of a side wall of an STI, and a thermal oxide film is arranged at the lower portion of the STI side wall, wherein a thermal oxide film portion is arranged to be wider than the liner width at the lower end portion of the nitride film liner.

According to another embodiment of the present invention, a nitride film liner is arranged at the upper portion of a trench side wall that is adjacent to an NMOS whereas the nitride film liner is not arranged at the trench side wall that is adjacent to a PMOS and a thermal oxide film is arranged to extend up to the upper end of the trench side wall on the PMOS side.

According to a more specific embodiment of the present invention, a semiconductor device is provided that includes:

a semiconductor substrate;

a device region disposed at a predetermined location of the semiconductor substrate; and a shallow trench isolation region that isolates the device region, the shallow trench isolation region including a trench;

a nitride film liner disposed at the upper portion of a side wall of the trench; and a thermal oxide film disposed at the lower portion of the side wall of the trench;

wherein the width of a second portion of the shallow trench isolation region at which the thermal oxide film is disposed is arranged to be wider than the width of a first portion of the shallow -trench isolation region at which the lower end of the nitride film liner is disposed.

According to another specific embodiment of the present invention, a semiconductor device is provided that includes:

a semiconductor substrate;

a shallow trench isolation region disposed at a predetermined location of the semiconductor substrate; and a first device region and a second device region that are disposed next to each other between which first device region and the second device region the shallow trench isolation region is disposed, the first device region and the second device region including a p-MOSFET and an n-MOSFET, respectively;

wherein the shallow trench isolation region includes
a trench;
a nitride film liner disposed at the upper portion of a first side wall of the trench that is adjacent to the n-MOSFET when viewed in cross section across the channel direction; and
a thermal oxide film disposed at the lower portion of the trench; wherein
the nitride film liner is not disposed at the upper portion of a second side wall of the trench that is adjacent to the p-MOSFET when viewed in cross section across the channel direction.

According to another specific embodiment of the present invention, a method for manufacturing a semiconductor device is provided that includes the steps of:

creating a first trench having a predetermined depth at a predetermined location of a semiconductor substrate;
arranging a nitride film on the inner side of the first trench;
removing the nitride film from the bottom portion of the first trench and exposing the semiconductor substrate through the bottom portion while preserving the nitride film arranged at the upper portion of the first trench;
performing thermal oxidation on the exposed bottom portion and creating a thermal oxide film extending from the lower end of the nitride film toward the semiconductor substrate.

According to a preferred embodiment, the method of manufacturing the semiconductor device according to the present invention further includes the steps of:

configuring the first trench to isolate a p-MOSFET region and an n-MOSFET region; and
after removing the nitride film from the bottom portion of the first trench, preserving the nitride film arranged at a first side wall of the first trench that is adjacent to the n-MOSFET region when viewed in cross section across the channel direction, and removing the nitride film from a second side wall of the first trench that is adjacent to the p-MOSFET when viewed in cross section across the channel direction.

BRIEF DESCRIPTION OF THE DRAWINGS

FIGS. 7A-7C are diagrams illustrating process steps for fabricating the STI structure of the first embodiment (part 2);

FIG. 10 is a diagram illustrating a second modified example of the STI structure according to the first embodiment;

DESCRIPTION OF THE PREFERRED EMBODIMENTS

In the following, preferred embodiments of the present invention are described with reference to the accompanying drawings.

First Embodiment

Figure 4:
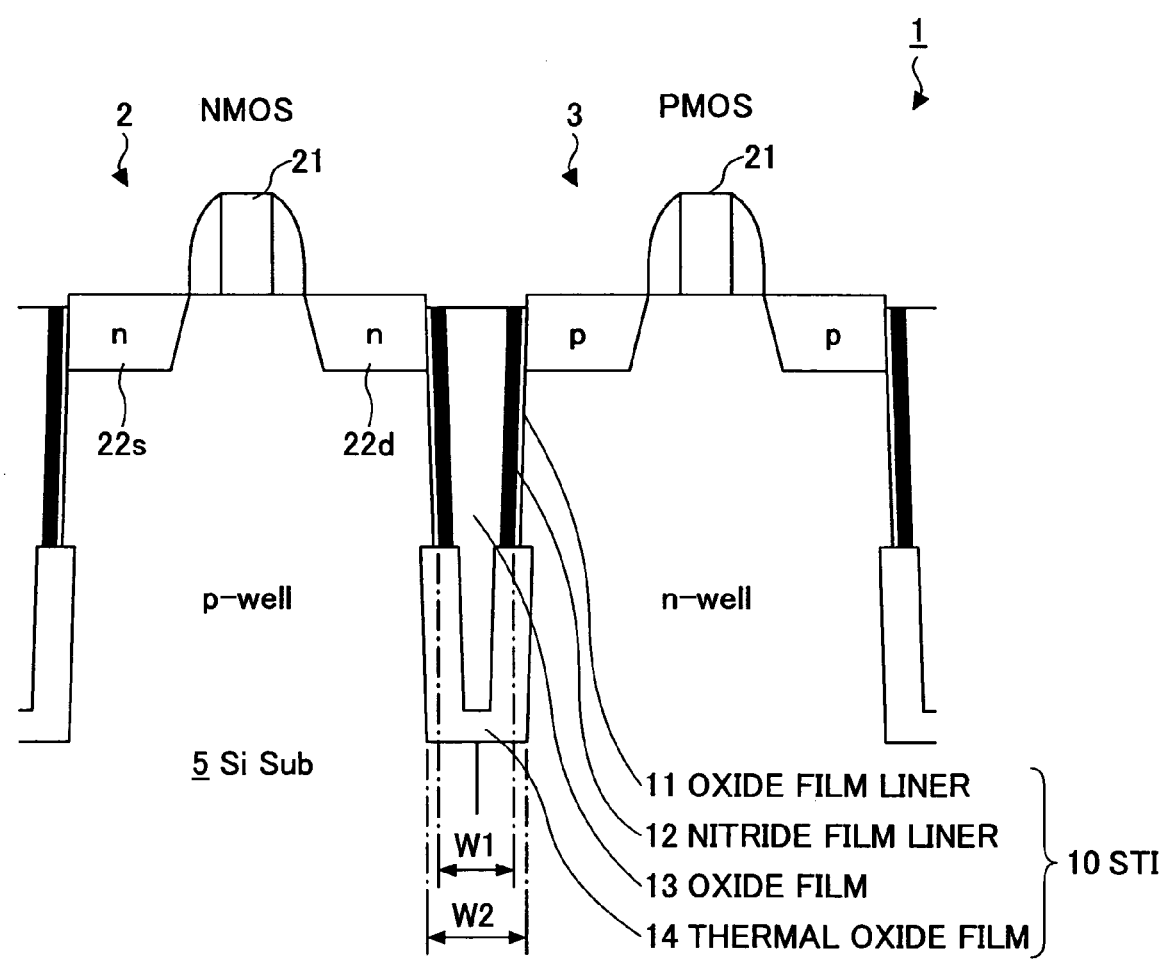
FIG. 4 is a cross-sectional diagram of a semiconductor device including a STI structure according to a first embodiment of the present invention.

FIG. 4 is a cross-sectional diagram showing a STI structure of a CMOS semiconductor device 1 according to a first embodiment of the present invention. In the first embodiment, the inner side upper portion of the side wall of the STI has a nitride film (e.g., nitride film liner 12) formed thereon, but the inner side lower portion of the side wall of the STI does not-have the nitride film formed thereon and the lower portion of the STI is arranged to be wider than the upper portion by performing a thermal oxidation process on the lower portion.

The CMOS semiconductor device 1 includes a silicon substrate 5, a NMOS transistor 2 that realizes an n-channel on the silicon substrate 5, a PMOS transistor 3 that realizes a p-channel on the silicon substrate 5, and a STI 10 for isolating the device regions of the NMOS transistor 2 and the PMOS transistor 3. The STI 10 includes an oxide film liner 11 that covers the inner side wall of the STI 10, the nitride film liner 12 that is arranged at the oxide film liner 11 at the upper portion of the side wall of the STI 10, a thermal oxide film 14 arranged at the lower portion of the STI 10, and an oxide film 13 filling in the trench of the STI 10. It is noted that by including the thermal oxide film 14 in the STI 10, the maximum width W2 of the lower portion of the STI 10 may be arranged to be wider than the width W1 of the STI 10 at the lower end portion of the nitride film liner 12.

By arranging the lower portion of the STI 10 to be wider, inter-device leakage caused by exposure positioning deviation occurring upon well implantation may be prevented. In other words, by enlarging the lower portion or the bottom portion of the STI 10 through thermal oxidation, the boundary between a p-well and an n-well may be positioned within the width range of the STI 10 even when exposure positioning deviation occurs.

Figure 3:
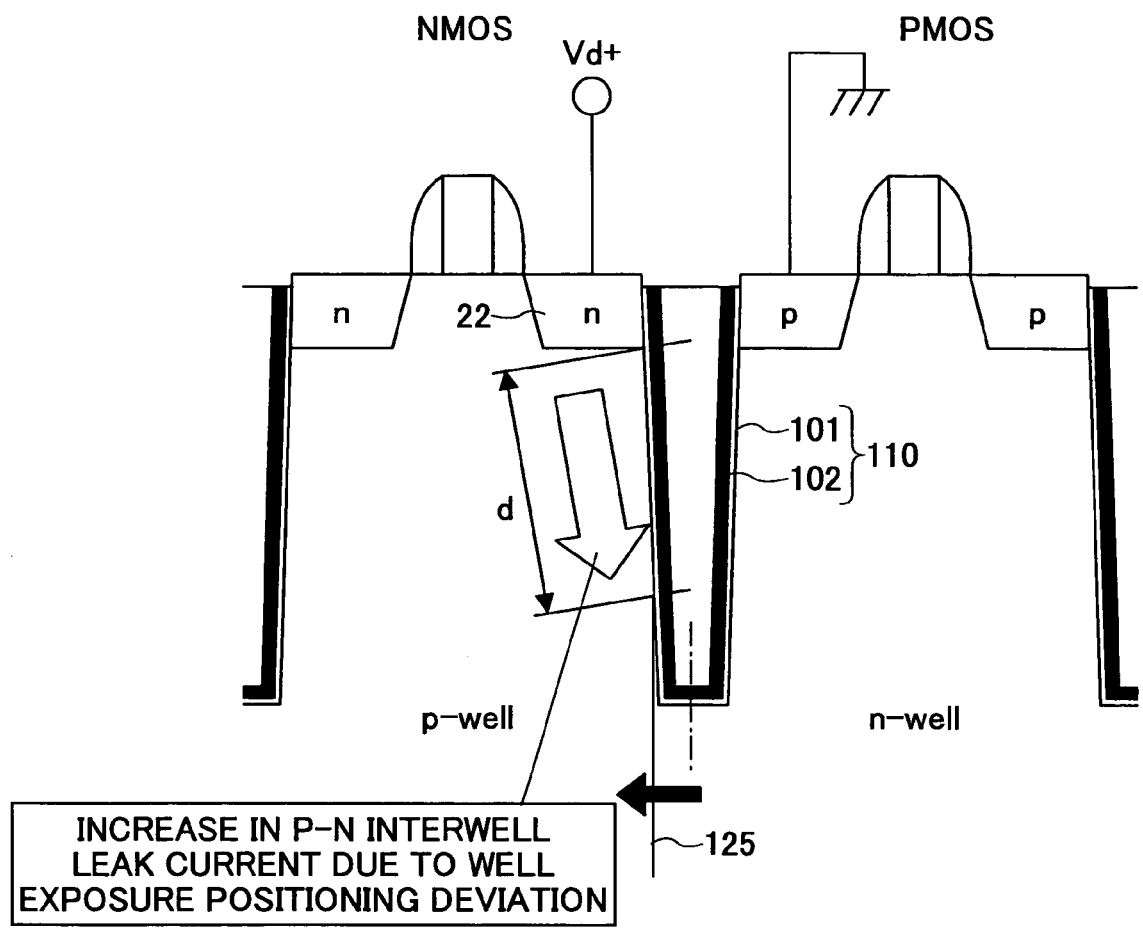
FIG. 3 is a diagram illustrating an underlying principle considered in developing embodiments of the present invention.
Figure 5:
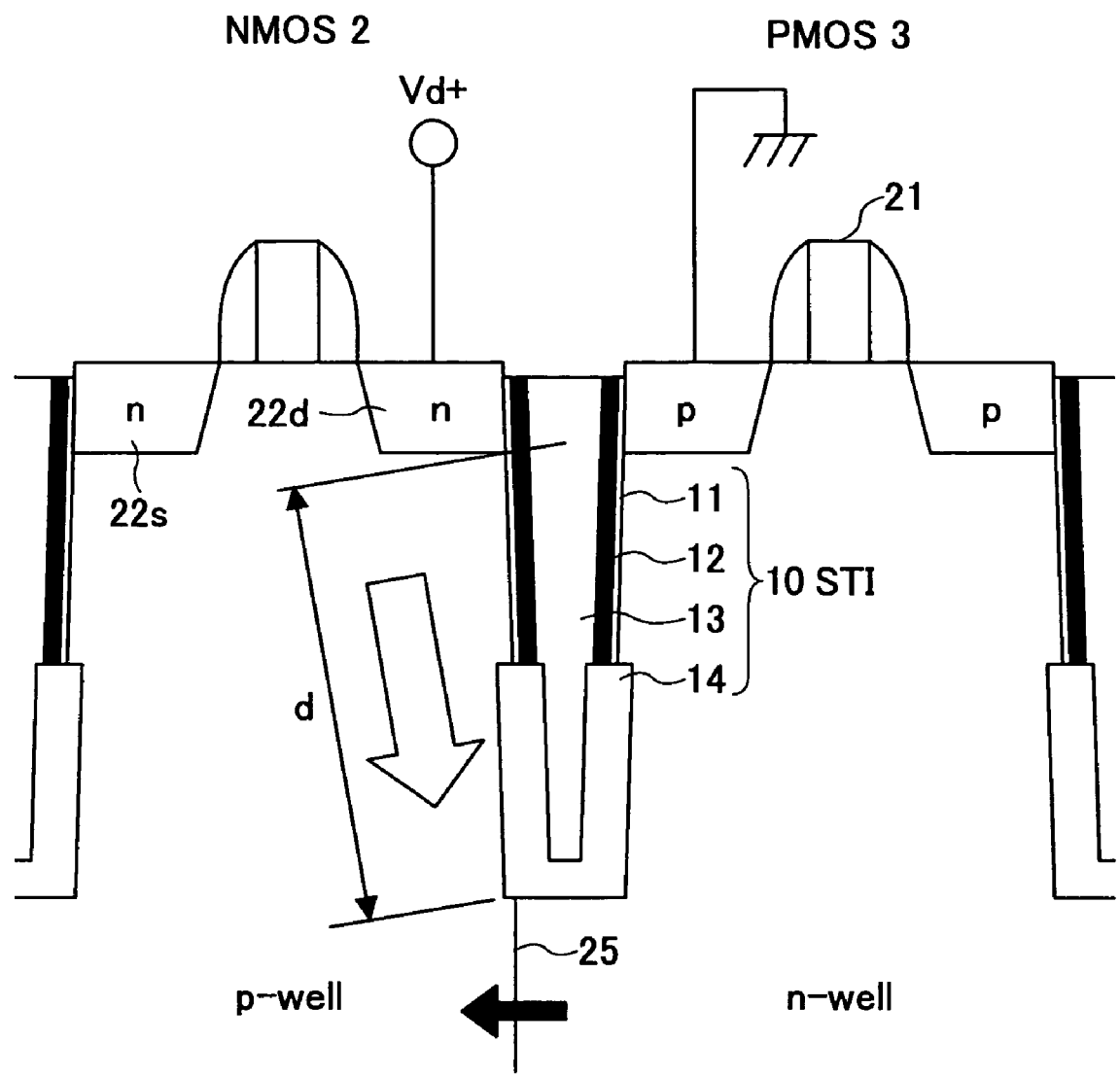
FIG. 5 is a diagram illustrating an advantage realized in the STI structure according to the first embodiment.

FIG. 5 is a diagram illustrating advantageous effects that may be obtained from the STI 10 according to the first embodiment. When a STI is arranged into a forward tapered shape as in the case of the STI 110 shown in FIG. 3, the well boundary 125 may deviate from the bottom surface of the STI 110 due to exposure positioning deviation in well implantation. With the miniaturization of device structures, the extent of exposure positioning deviation may exceed the width of the bottom surface of the STI 110, and in such a case, the distance d between the well boundary 125 and the n-drain 22d may be reduced to cause a substantial increase in the inter-device leak current.

The STI 10 according to the first embodiment as is shown in FIG. 4 is arranged to have its lower portion enlarged through thermal oxidation so that the width of the lower portion of the STI 10 is at least equal to the exposure positioning deviation margin. In this way, even when exposure positioning deviation occurs, a well boundary 25 between the p-well and the n-well may be within the width range of the bottom surface of the STI 10 so that inter-device pressure resistance characteristics may be improved.

FIGS. 6A-6C and FIGS. 7A-7C are diagrams illustrating process steps for fabricating the STI 10 according to the first embodiment.

Figure 6C:
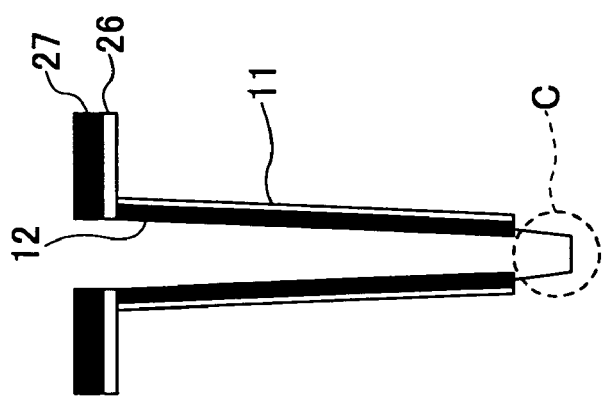
FIGS. 6A-6C are diagrams illustrating process steps for fabricating the STI structure of the first embodiment (part 1)
Figure 6B:
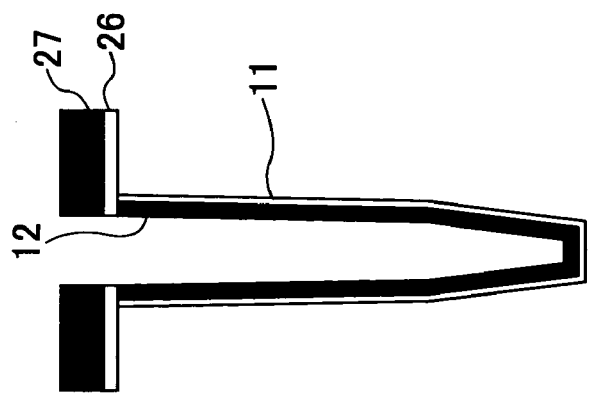
Figure 6A:
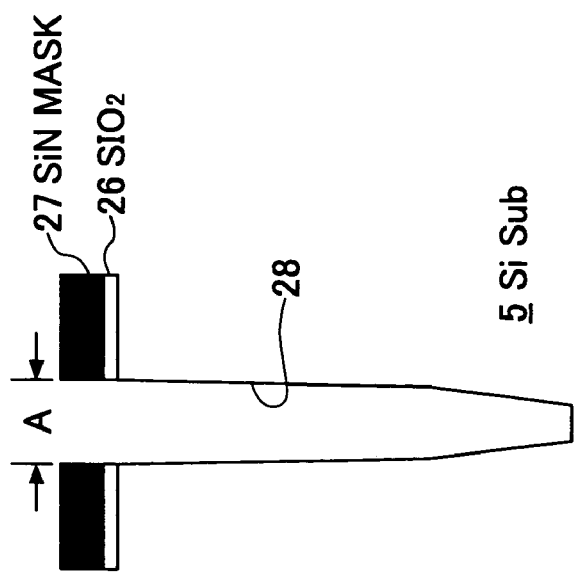

First, as is shown in FIG. 6A, a thermal oxide film 26 and a silicon nitride film 27 as an etching mask are deposited on the silicon substrate 5, and a mask pattern having a predetermined opening is created through photolithography. In this example, the opening width A of the mask pattern is arranged to be approximately 80-130 nm. This pattern is used as a mask to create a first trench 28 through dry etching. In one example, the dry etching may be realized through RIE (Reactive Ion Etching) using mixed gas containing HBr and oxygen at a pressure of 1-100 Pa and a frequency of 13.56 MHz. In this way, a forward tapered shape trench 28 at a depth of 100-300 nm and an angle of 80-90 degrees may be formed.

Then, as is shown in FIG. 6B, thermal oxidation is performed to create a thermal oxide film with a thickness of approximately 5 nm which oxide film becomes the oxide film liner 11 corresponding to the outermost film of the STI 10. Then, the nitride film liner 12 having a thickness of approximately 5-20 nm is deposited through CVD.

Then, as is shown in FIG. 6C, the nitride film liner 12 arranged at the bottom portion of the STI 10 is removed through RIE while the nitride film liner 12 arranged at the side walls of the first trench is left intact. In this way, the silicon substrate 5 may be exposed through the bottom portion C of the first trench 28. In the present example, the nitride film etching is realized through RIE by supplying CF reactive gas (e.g., CF4, CHF3, C2F6, C4F8) and setting the pressure to 1-100 Pa and the frequency to 13.56 MHz.

Then, as is shown in FIG. 7A, etching is performed once again to form a second trench 29. In this etching process, RIE may be performed using mixed gas containing HBr and oxygen at a pressure of 1-100 Pa and a frequency of 13.56 MHz, for example. In this way, the second trench may be arranged into a forward tapered shape trench at a depth of 10-100 nm and an angle of approximately 80-90 degrees.

Then, as is shown in FIG. 7B, thermal oxidation is performed on the second trench 29. For example, wet oxidation or dry oxidation may be performed at a temperature of 800-1000° C. to create the thermal oxide film 14 having a thickness of approximately 5-30 nm. It is noted that in this process, the side wall of the first trench 28 is not oxided owing to the existence of the nitride liner 12.

Then, as is shown in FIG. 7C, a HDP (High Density Plasma) oxide film or a SOG (Spin On Glass) oxide film is deposited to form the oxide film 13 filling in the trench, and surface planarization is performed through CMP (Chemical Mechanical Polishing). In this way, the STI 10 may be realized in which the device isolation width W2 at the portion where the thermal oxide film 14 is disposed is arranged to be wider than the width W1 at the lower end portion of the nitride film liner 12.

According to an aspect of the first embodiment, the nitride film liner 12 at the upper portion of the trench may reduce the stress applied to the channel region from the oxide film 13 and prevent current degradation particularly at the n-type MOSFET. Also, by widening the lower portion of the STI 10, a substantial increase in leak current generation due to exposure positioning deviation in well implantation may be prevented.

FIGS. 8A-8C and FIGS. 9A-9B are diagrams illustrating process steps for fabricating the STI 10 of the first embodiment according to a first modified example. In this modified example, etching of the second trench 29 is not performed, and thermal oxidation is performed on the exposed lower portion of the first trench 28 to increase its width.

Figure 8C:
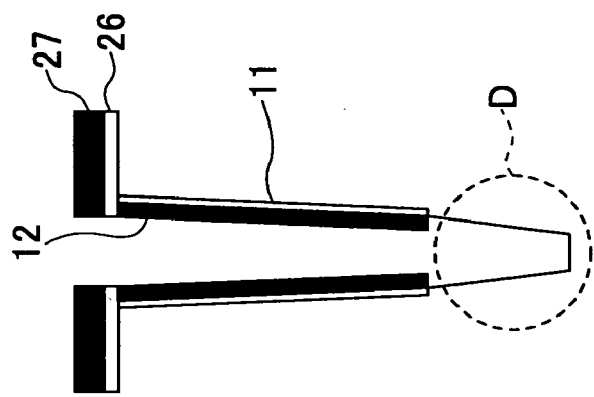
FIGS. 8A-8C are diagrams illustrating process steps for fabricating the STI structure of the first embodiment according to a first modified example (part 1)
Figure 8B:
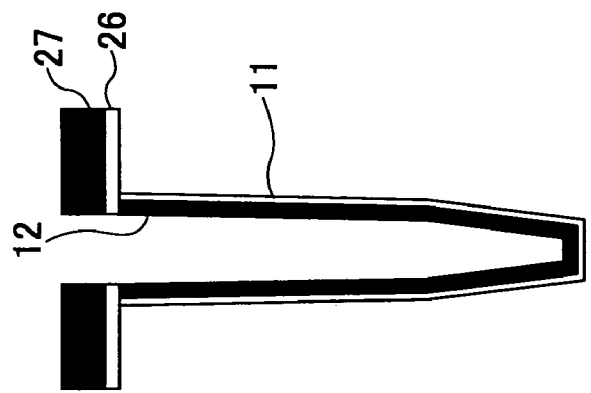
Figure 8A:
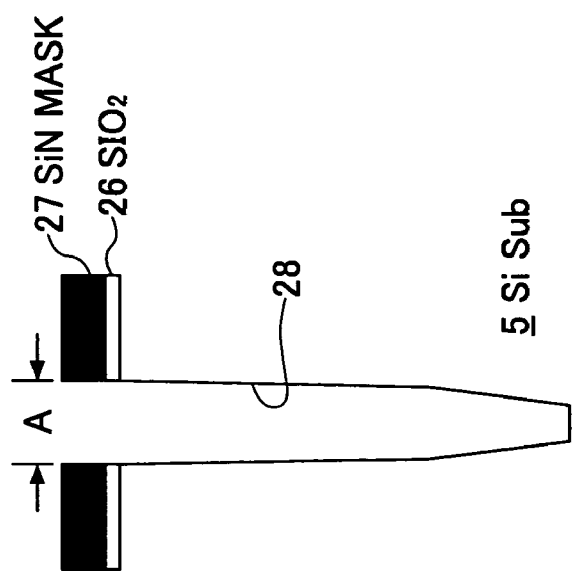

First, as is shown in FIG. 8A, a mask 27 having a predetermined pattern is created using a silicon nitride film to thereby create a forward tapered shape trench 28 at a depth of 100-300 nm and an angle of 80-90 degrees through dry etching. It is noted that the conditions for this dry etching process may be identical to the conditions used in the process step of FIG. 6A, for example.

Then, as is shown in FIG. 8B, thermal oxidation is performed to create an oxide film with a thickness of approximately 5 nm as the oxide film liner 11 corresponding to the outermost film of the STI 10. Then, the nitride film liner 12 with a thickness of approximately 5-20 nm is deposited through CVD.

Then, as is shown in FIG. 8C, the nitride film liner 12 arranged at the bottom portion of the STI 10 is removed through RIE while the nitride film liner 12 arranged at the upper side walls of the first trench is left behind. In this way, the silicon substrate 5 may be exposed through the bottom portion D of the first trench 28. It is noted that the portion of the trench from which the nitride film liner 12 is removed may correspond to a region within 20-50 nm from the bottom of the trench 28, for example.

Figure 9B:
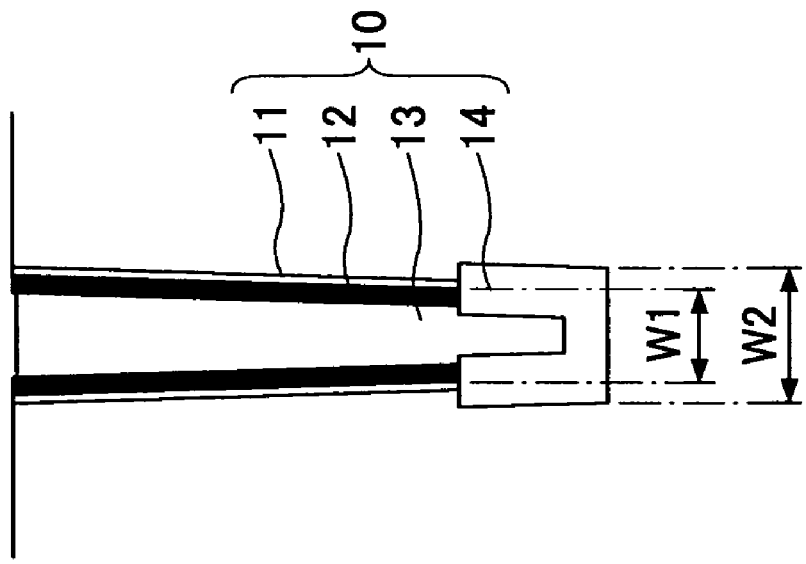
FIGS. 9A and 9B are diagrams illustrating process steps for fabricating the STI structure of the first embodiment according to the first modified example (part 2)
Figure 9A:
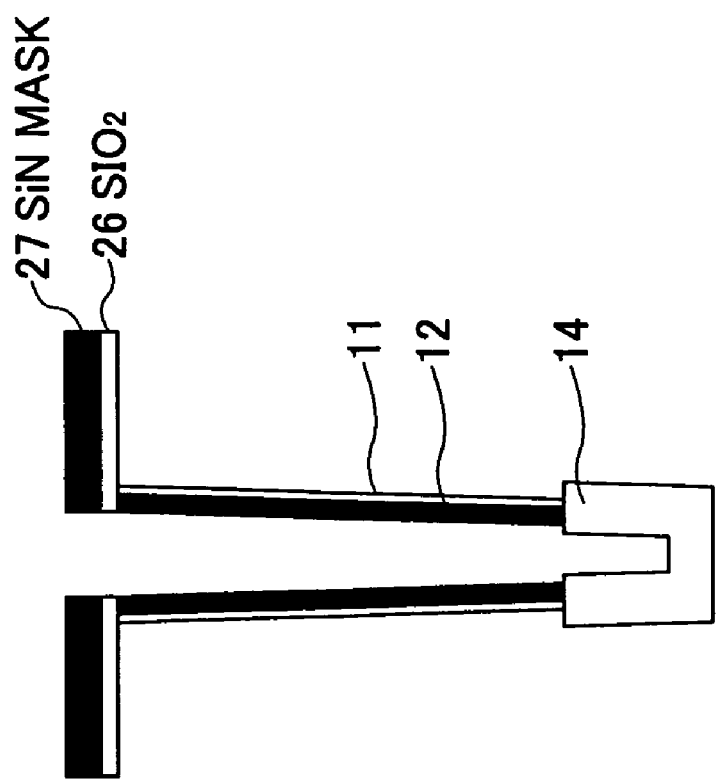

Then, as is shown in FIG. 9A, thermal oxidation is performed on the exposed region D at the bottom portion of the trench 28. For example, wet oxidation or dry oxidation may be performed at a temperature of 800-1000° C. to create the thermal oxide film 14 having a film thickness of approximately 5-30 nm. It is noted that in this process, the upper portion of the trench 28 is not oxided owing to the existence of the nitride liner 12. In this way, a thermal oxide film region may be created at the lower portion (bottom portion) of the trench 28 which thermal oxide film region is arranged to have a width that is greater than the width of the trench at the nitride film liner 12 lower end portion.

Then, as is shown in FIG. 9B, a HDP (High Density Plasma) oxide film or a SOG (Spin On Glass) oxide film is deposited as the oxide film 13, and surface planarization is performed through CMP (Chemical Mechanical Polishing). As can be appreciated from the above descriptions, in the present example, the thermal oxide film 14 that is created at the bottom portion of the trench 28 where the nitride film liner 12 is removed realizes a device isolation width W2 that is wider than the width W1 at the nitride film liner 12 lower end portion. According to this example, even when exposure positioning deviation occurs in well implantation, an adequate margin may be secured owing to the wide thermal oxide film 14 at the STI bottom portion, and thereby, inter-device leak current generation due to the reduction in the distance between the well boundary and the drain may be avoided as in the example illustrated in FIGS. 6A-6C and FIGS. 7A-7C. Also, the stress generated from the oxide film 13 that is applied to the channel region may be alleviated. As a consequence, a variation in inter-device pressure resistance characteristics may be controlled, and current characteristics may be improved particularly in the n-type MOSFET, for example.

FIG. 10 is a diagram illustrating a second modified example of the STI structure according to the first embodiment. As is illustrated in this example, depending on STI fabricating conditions, the nitride film liner 12 arranged at the trench may curve slightly inward. Even in such a case, the thermal oxide film 14 may be arranged to be wider than the nitride film liner 12 lower end portion, and the width W2 of the STI 10 at the portion where the thermal oxide film 14 is positioned may be arranged to be wider than the width W1 of the STI 10 at the nitride film liner 12 lower end portion. Accordingly, the stress applied to a device region may be controlled and leak current generation may be suppressed in this example as well.

Second Embodiment

Figure 11:
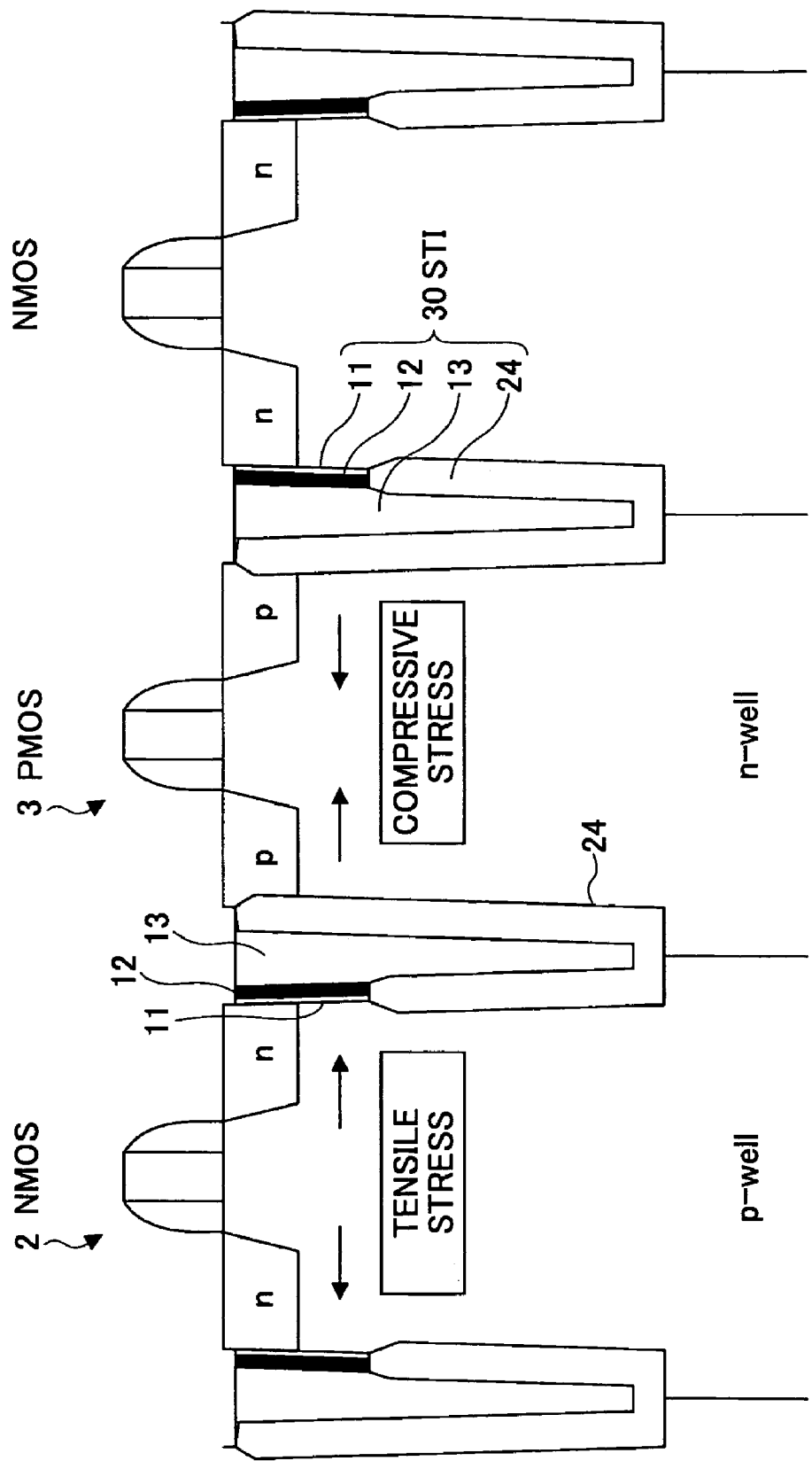
FIG. 11 is a cross-sectional diagram of a semiconductor device including a STI structure according to a second embodiment of the present invention.

FIG. 11 is a diagram illustrating a STI structure according to a second embodiment of the present invention. As is shown in this drawing, in the present embodiment, the configuration of the liner arranged at the STI side wall when viewed in cross section across the channel direction is arranged such that at least a trench side wall that is adjacent to the PMOS does not have a nitride film liner 12 arranged thereon. Instead, a thermal oxide film 24 is arranged on this trench side wall adjacent to the PMOS. Also, at a trench side wall adjacent to the NMOS, the nitride film liner 12 is arranged at the upper portion of this side wall while the thermal oxide film 24 is arranged on the lower portion of this side wall.

More specifically, FIG. 11 is a cross-sectional diagram of a CMOS semiconductor device cut across the channel direction. The CMOS semiconductor device of FIG. 11 includes a silicon substrate 5, an NMOS transistor 2 realizing an n-channel, a PMOS transistor 3 realizing a p-channel, and a STI 30 for isolating the respective device regions of the NMOS transistor 2 and the PMOS transistor 3. The STI 30 includes the nitride film liner 12 that is arranged on the upper portion of the side wall at the NMOS 2 side via an oxide film liner 11, a thermal oxide film 24 that extends from the lower end of the nitride film liner 12 and covers the bottom portion of the STI 30 and the side wall of the STI 30 at the PMOS 3 side, and an oxide film 13 arranged in the interior portion of the STI 30. By arranging the thermal oxide film 24 at the STI 30 as is described above, the lower portion (bottom portion) of the STI 30 may be arranged to be wider than the width at the lower end portion of the nitride film liner 12.

It is noted that the STI structure according to the present embodiment is arranged to have a configuration as is described above in view of the difference in characteristics between the NMOS and the PMOS, namely, the fact that in the NMOS, mobility decreases when compressive stress in the channel direction is applied, whereas in the PMOS, mobility increases when compressive stress in the channel direction is applied. More specifically, at the PMOS side, mobility may be increased by having the compressive stress of the thermal oxide film 24 applied to the p-channel region, whereas at the NMOS side, the nitride film liner 12 is arranged in order to have tensile stress applied to the n-channel region to thereby increase the drive current.

According to the present embodiment, the nitride film liner 12 is arranged at the side wall of the STI 30 that is adjacent to the NMOS, and stress control is performed individually for the PMOS and the NMOS. Also, the thermal oxide film 24 is arranged to enlarge the width of the bottom portion of the STI 30 so that the boundary between the PMOS and the NMOS may be positioned within the bottom portion covering a region that is wider than the well exposure positioning deviation width. In this way, an increase in interwell leak current due to well exposure positioning deviation with the miniaturization of the semiconductor device may be prevented.

FIGS. 12A through 14C are diagrams illustrating process steps for fabricating the semiconductor device according to the second embodiment.

Figure 12A:
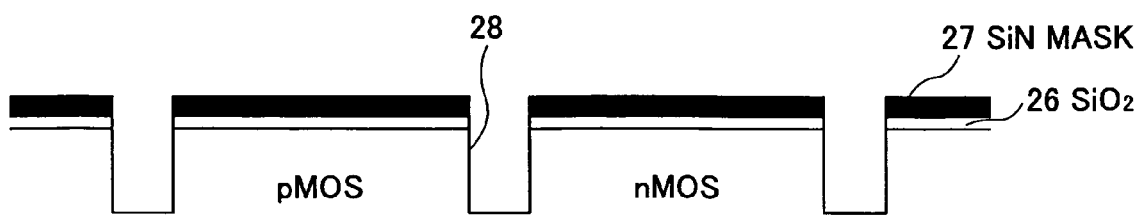
FIGS. 12A-12C are diagrams illustrating process steps for fabricating the STI structure of the second embodiment (part 1)

First, as is shown in FIG. 12A, a thermal oxide film 26 and a silicon nitride film as an etching mask are deposited on the silicon substrate 5, and a mask pattern 27 having a predetermined opening is created through photolithography after which a trench 28 is formed through etching. As the etching step, for example, RIE (Reactive Ion Etching) may be performed using mixed gas containing HBr and oxygen at a pressure of 1-100 Pa and a frequency of 13.56 MHz to create a shallow trench 28 at a depth of approximately 10-5.0 nm.

Figure 12B:
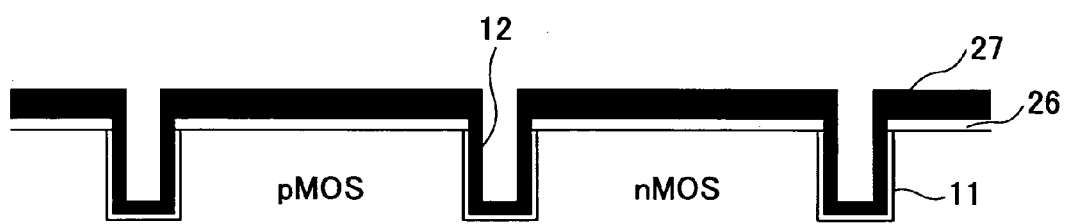

Then, as is shown in FIG. 12B, thermal oxidation is performed to create a thermal oxide film with a thickness of approximately 5 nm which oxide film becomes the oxide film liner 11 corresponding to the outermost film of the STI 30. Then, the nitride film 12 having a film thickness of approximately 5-20 nm is deposited through CVD.

Figure 12C:
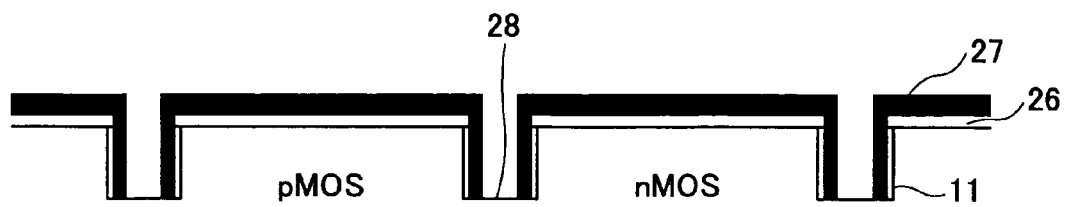

Then, as is shown in FIG. 12C, RIE is performed to remove the nitride film 12 from the bottom portion of the trench 28 while the nitride film 12 at the side wall of the trench 28 is left behind to form the nitride film liner 12. In this process, the silicon substrate 5 is exposed through the bottom portion of the trench 28. It is noted that the etching of the nitride film 12 may be realized through RIE using CF reactive gas (e.g., CF4, CHF3, C2F6, C4F8) and at a pressure of 1-100 Pa and a frequency of 13.56 MHz, for example.

Figure 13A:
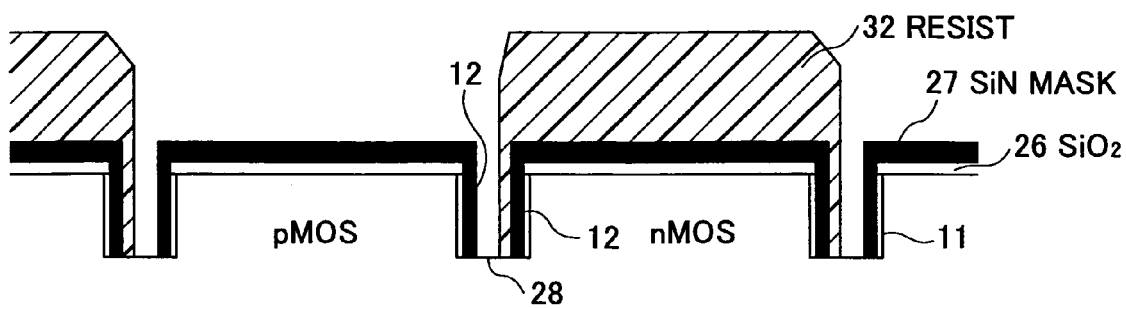
FIGS. 13A-13C are diagrams illustrating process steps for fabricating the STI structure of the second embodiment (part 2)
Figure 13B:
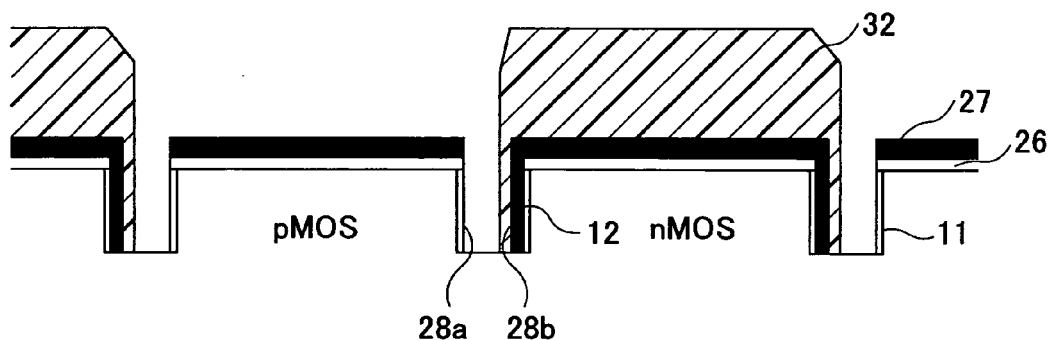

Then, as is shown in FIG. 13A, a resist pattern 32 is used that covers the NMOS region and the nitride film liner 12 arranged on the side wall of the trench 28 that is adjacent to the NMOS when viewed in cross section across the channel direction. By arranging the resist pattern 32 to have a configuration as is described above, the nitride film liner 12 arranged at the side wall of the trench 28 that is adjacent to the PMOS may be exposed. It is noted that the resist pattern 32 covering the nitride film liner 12 at the NMOS side is used as a mask in a subsequent thermal oxidation process as is described below.

Figure 15A:
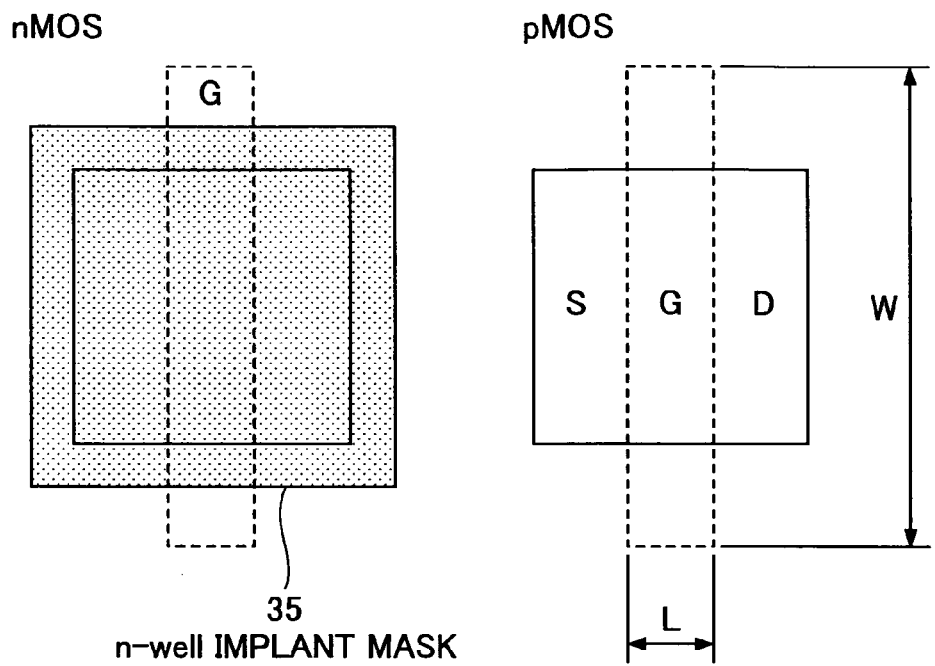
FIGS. 15A and 15B are diagrams showing exemplary configurations of a resist mask to be used upon etching a nitride film arranged on a trench side wall that is adjacent to a PMOS.

As the resist pattern 32, an exposure mask used for patterning during n-well implantation may be used as the mask covering the NMOS region as is shown in FIG. 15A. In this case, a mask pattern 35 covering only the NMOS region is formed. In turn, the thermal oxide film 24 is arranged at the side wall of the STI 30 adjacent to the PMOS in biaxial directions, namely, in the gate width direction (W) and the gate length direction (L) that is perpendicular to the gate width direction.

It is noted that the compressive stress in the direction perpendicular to the channel direction at the PMOS side (i.e., gate width direction) may degrade mobility of the PMOS. Thus, in order to increase mobility in the PMOS region, the nitride film liner 12 arranged at the STI side wall adjacent to the PMOS when viewed in cross section across the direction perpendicular to the channel direction is preferably not etched (removed) so as to prevent thermal oxidation of this STI side wall.

Figure 15B:
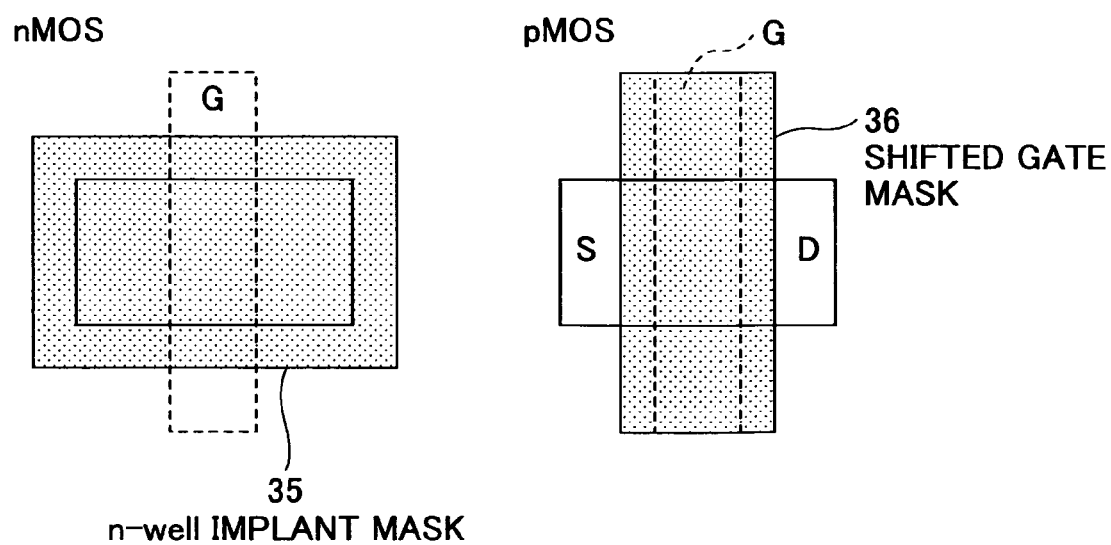

In order to realize such an arrangement, a mask pattern as is shown in FIG. 15B may be used, for example. It is noted that this mask pattern may be newly created, or as a simpler alternative, the n-well pattern mask 35 and a mask 36 that is created from a gate electrode (G) pattern mask that is shifted and enlarged may be layered and combined. By using such a mask, compressive stress from the STI may be applied in the channel direction (source-drain directions) at the PMOS while the compressive stress in the direction perpendicular to the channel direction may be reduced owing to the existence of the nitride film liner 12. As a result, operations speed at the PMOS may be improved.

Referring back to FIG. 13B, using the resist pattern as is shown in FIG. 13A, the nitride film liner 12 arranged at the side wall 28a that is adjacent to the PMOS when viewed in cross section across the channel direction of the trench 28 is etched and removed. On the other hand, the nitride film liner 12 arranged at the side wall 28b adjacent to the NMOS is protected by the resist mask 32. It is noted that the etching may be realized through isotropic dry etching using mixed gas containing CF4, oxygen, and nitrogen, at a pressure of 10-1000 Pa, for example.

Figure 13C:
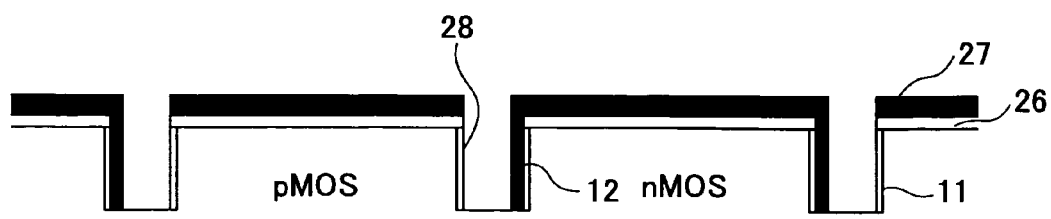

Then, as is shown in FIG. 13C, the resist pattern 32 is removed through ashing and acid cleaning using sulfuric acid and hydrogen peroxide, for example.

Figure 14A:
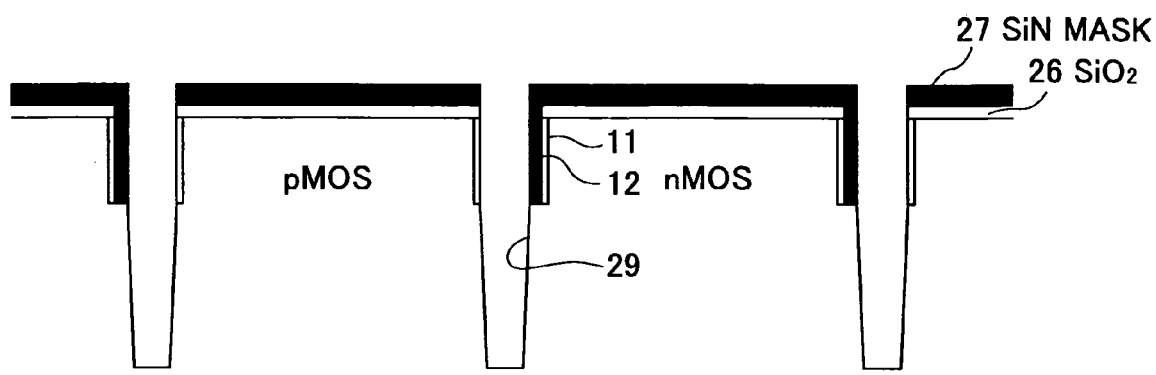
FIGS. 14A-14C are diagrams illustrating process steps for fabricating the STI structure of the second embodiment (part 3)

Then, as is shown in FIG. 14A, a second trench 29 is formed by deepening the first trench 28. For example, RIE may be performed using mixed gas containing HBr and oxygen, at a pressure of 1-100 Pa and a frequency of 13.56 MHz to create the second trench 29 at a depth of approximately 50-200 nm.

Figure 14B:
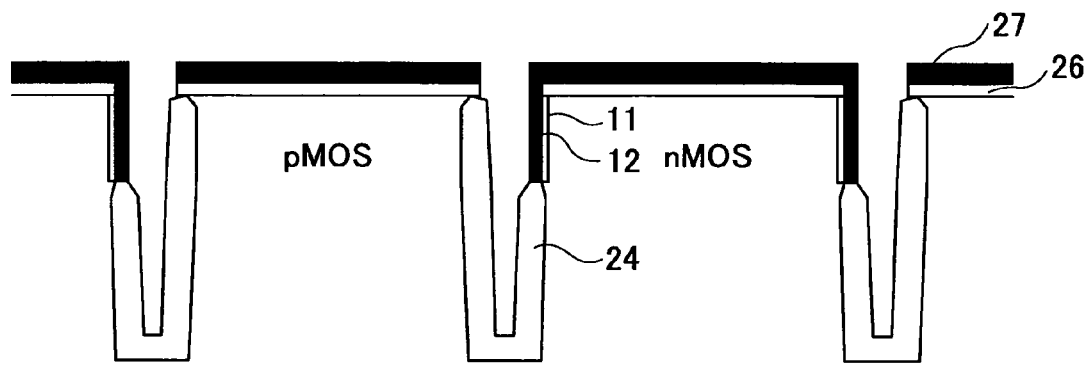

Then, as is shown in FIG. 14B, the thermal oxide film 24 is arranged to extend from the lower end of the nitride film liner 12 arranged at the trench side wall adjacent to the NMOS to cover the bottom portion of the second trench 29 and the trench side wall adjacent to the PMOS. For example, thermal oxidation may be performed through wet oxidation or dry oxidation at a temperature of approximately 800-1000° C. to create an oxide film with a thickness of approximately 5-30 nm. In this case, the upper portion of the trench side wall at the NMOS side is not oxidized since the nitride film liner 12 is arranged thereon. Thus, the trench configuration according to the present embodiment may be realized in which the nitride film liner 12 is arranged at the upper portion of the side wall at the NMOS side, and the thermal oxide film 24 is arranged to extend from the lower portion of the side wall at the NMOS side to the bottom portion of the trench and the side wall at the PMOS side.

Figure 14C:
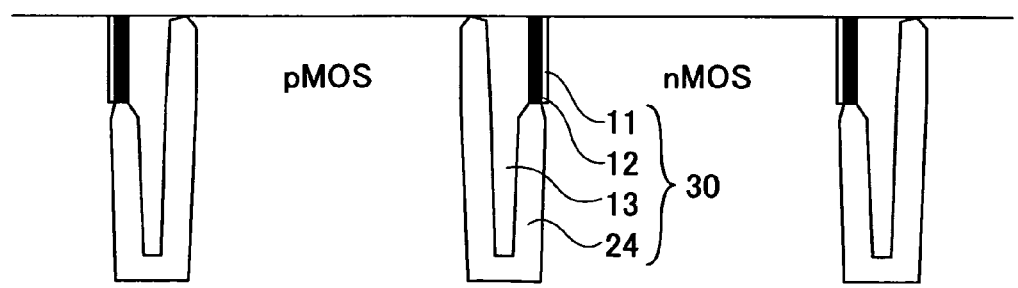

Then, as is shown in FIG. 14C, the oxide film 13 is deposited within the STI trench, and a planarization process is performed. For example, an implant film such as a HDP (High-Density-Plasma) oxide film or a SOG (Spin-On-Glass) oxide film may be deposited within the STI trench, and surface planarization may be realized through CMP.

By realizing an STI structure as is described above, even in a case where exposure positioning deviation occurs in a subsequent resist exposure process for realizing well implantation, the extent of exposure positioning deviation may be within the device isolation region in which the thermal oxide film 24 is arranged, and thereby, the well boundary may be accurately positioned within the bottom surface portion of the device isolation region.

Figure 1:
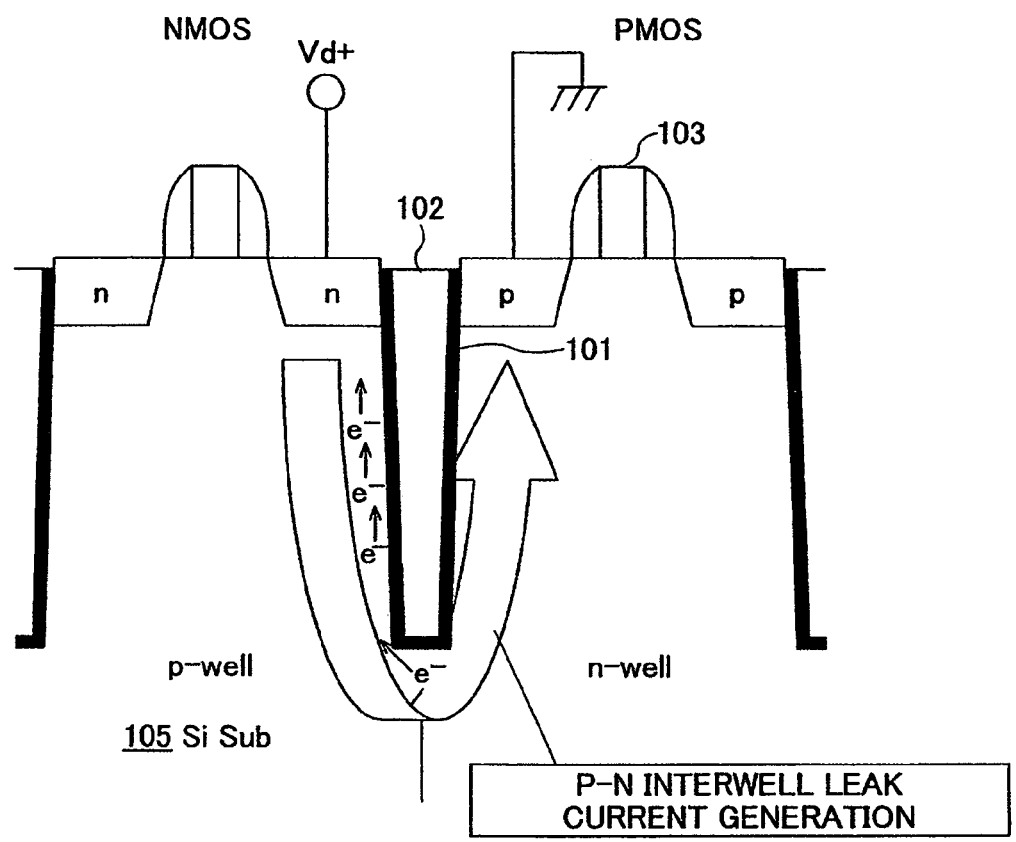
FIG. 1 is a diagram illustrating P-N interwell leak current generated in a STI structure.
Figure 2:
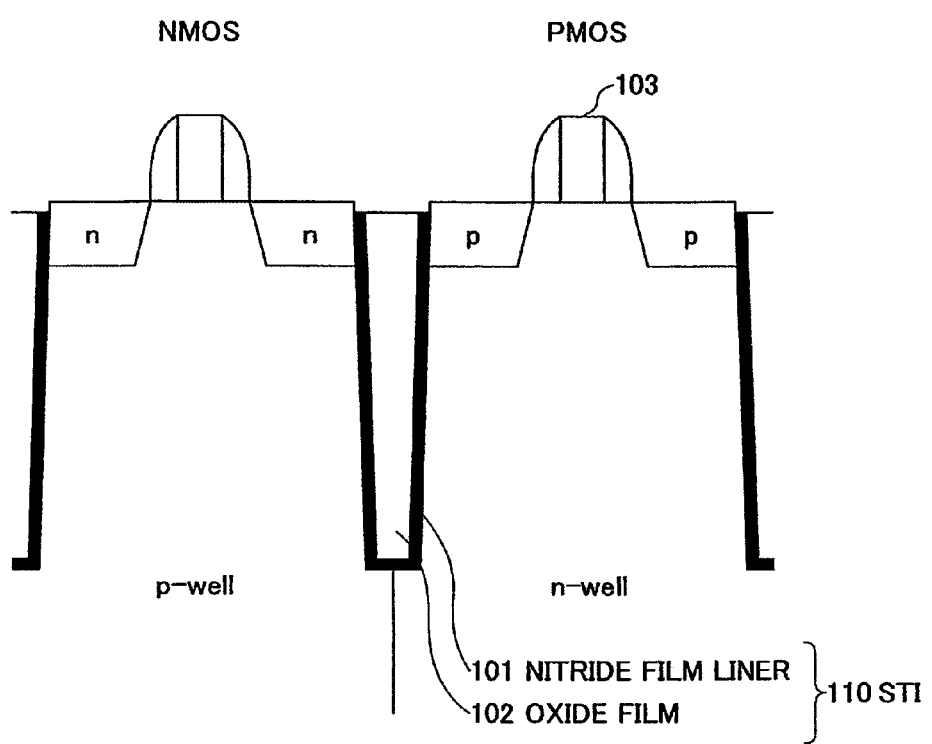
FIG. 2 is a diagram showing an exemplary STI structure including a nitride film liner.
Figure 16:
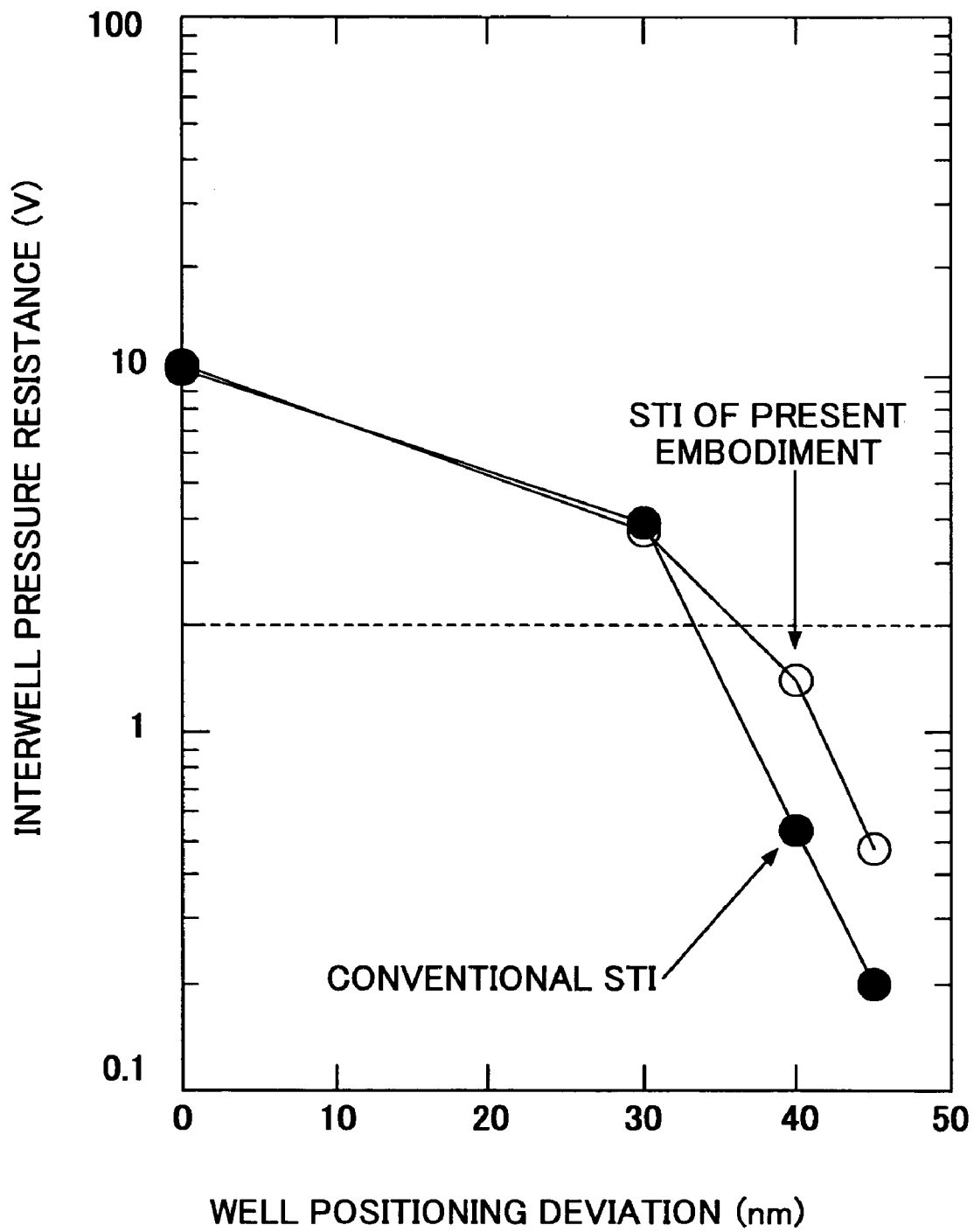
FIG. 16 is a graph showing pressure resistance characteristics of a semiconductor device according to an embodiment of the present invention.

FIG. 16 is a graph showing the pressure resistance realized in the STI structure shown in FIG. 4 as a representative example of the present invention. In this graph the pressure resistance realized in the STI structure shown in FIG. 2 is shown as a comparison example. The STI structure as a representative example of the present invention is arranged to have a width of 100 nm at the surface of the substrate, and is fabricated by creating a first trench having a depth of 280 nm, arranging an oxide film liner with a film thickness of 5 nm, arranging a nitride film liner with a film thickness of 20 nm thereon, and removing the nitride film arranged at the trench bottom portion through RIE to expose the silicon substrate. Then, trench etching is performed to further increase the depth of the trench by 50 nm to form a second trench, and thermal oxidation is performed to form an oxide film with a film thickness of 20 nm.

As the comparison example, the STI structure of FIG. 2 (conventional STI structure) is used. It is assumed that this STI structure is arranged to have a width of 100 nm at the substrate surface, and is fabricated by creating a 330 nm-deep trench having a forward tapered shape, and covering the entire inner wall portion of the trench with an oxide film liner having a film thickness of 5 nm and a nitride film liner having a film thickness of 20 nm.

As shown in the graph of FIG. 16, the difference in interwell NPN pressure resistance (the voltage value when a 1 nA/μm current flows upon applying a reverse bias) between the STI structure according to the present embodiment and the conventional STI structure becomes prominent when the well boundary deviates from the target position by 30 nm or more. As can be appreciated, when the well positioning deviation amount reaches 30 nm or more, the pressure resistance of the STI structure according to the present embodiment may be approximately two times greater than that of the conventional STI structure.

Also, it is noted that in the STI structure according to the second embodiment of the present invention as is shown in FIG. 11, compressive stress in the channel direction at the PMOS side is increased, and as a result, mobility may be increased further by approximately 10% and the current characteristics may be improved as well.

As can be appreciated from the above descriptions, according to an aspect of the present invention, even when the device scale is further reduced in future applications, good pressure resistance characteristics may still be realized by adequately suppressing current leakage caused by exposure positioning deviation and controlling the stress from the STI.

More specifically, according to an aspect of the first embodiment, in a CMOS semiconductor device having a STI, an increase in P-N interwell leak current due to a variation in well exposure positioning deviation may be prevented, and stress from the STI may be controlled to thereby prevent mobility degradation particularly in the n-type MOSFET.

According to an aspect of the second embodiment, in a CMOS semiconductor device having a STI, an increase in P-N interwell leak current due to a variation in well exposure positioning deviation may be prevented, and stress in the n-type MOSFET and the p-type MOSFET may be individually controlled to thereby improve mobility in both the n-type and p-type MOSFETs.

Further, it is noted that the present invention is not limited to the above-described embodiments, and variations and modifications may be made without departing from the scope of the present invention.

The present application is based on and claims the benefit of the earlier filing date of Japanese Patent Application No. 2005-171277 filed on Jun. 10, 2005 and Japanese Patent Application No. 2005-331700 filed on Nov. 16, 2005, the entire contents of which are hereby incorporated by reference.

What is claimed is:

1. A semiconductor device, comprising:
   a semiconductor substrate;
   a device region disposed at a predetermined location of the semiconductor substrate; and
   a shallow trench isolation region that isolates the device region, the shallow trench isolation region including
      a trench;
      a nitride film liner disposed at an upper portion of a side wall of the trench; and
      a thermal oxide film disposed at a lower portion of the side wall of the trench;
   wherein a second width of a second portion of the shallow trench isolation region at which second portion the thermal oxide film is disposed is arranged to be wider than a first width of a first portion of the shallow trench isolation region at which first portion a lower end of the nitride film liner is disposed.

2. A semiconductor device, comprising:
   a semiconductor substrate;
   a shallow trench isolation region disposed at a predetermined location of the semiconductor substrate; and
   a first device region and a second device region that are disposed next to each other between which first device region and the second device region the shallow trench isolation region is disposed, the first device region and the second device region including a p-MOSFET and an n-MOSFET, respectively;
   wherein the shallow trench isolation region includes
      a trench;
      a nitride film liner disposed at an upper portion of a first side wall of the trench which first side wall is adjacent to the n-MOSFET when viewed in cross section across a channel direction; and
      a thermal oxide film disposed at a lower portion of the trench; wherein
      the nitride film liner is not disposed at an upper portion of a second side wall of the trench which second side wall is adjacent to the p-MOSFET when viewed in cross section across the channel direction.

3. The semiconductor device as claimed in claim 2, wherein
   the thermal oxide film is arranged to extend from the lower portion of the trench to an upper end of the second trench side wall.

4. The semiconductor device as claimed in claim 2, wherein
   the nitride film liner is not disposed at a third side wall of the trench which third side wall is adjacent to the p-MOSFET when viewed in cross section across a direction perpendicular to the channel direction.

5. The semiconductor device as claimed in claim 2, wherein
   the thermal oxide film is arranged on a third side wall of the trench which third side wall is adjacent to the p-MOSFET when viewed in cross section across a direction perpendicular to the channel direction.

6. The semiconductor device as claimed in claim 2, wherein
   the nitride film liner is arranged on an upper portion of a third side wall of the trench which third side wall is adjacent to the p-MOSFET when viewed in cross section across a direction perpendicular to the channel direction; and
   the thermal oxide film is arranged on a lower portion of the third side wall.

7. The semiconductor device as claimed in claim 2, wherein
   the shallow trench isolation region further includes an oxide film liner that is disposed at a periphery of the nitride film liner.

8. The semiconductor device as claimed in claim 2, wherein
   an isolation width of a portion of the shallow trench isolation region at which portion the thermal oxide film is disposed is arranged to be greater than an exposure positioning deviation margin for well implantation.

9. The semiconductor device as claimed in claim 2, wherein
   the shallow trench isolation region further includes an oxide film that is employed to fill in the trench.

10. A method for manufacturing a semiconductor device, comprising the steps of:
    forming a first trench having a predetermined depth at a predetermined location of a semiconductor substrate;
    forming a nitride film over an inner side of the first trench;
       removing the nitride film from a bottom portion of the first trench and exposing the semiconductor substrate through the bottom portion while preserving the nitride film arranged at an upper portion of the first trench;
       etching a second trench from the bottom portion of the first trench after removing the nitride film; and
       performing thermal oxidation on the exposed bottom portion and forming a thermal oxide film extending from a lower end of the nitride film toward the semiconductor substrate;
    wherein the thermal oxidation is performed on the second trench and the thermal oxide film extending from the lower end of the nitride film toward the semiconductor substrate is arranged at the second trench.

11. A method for manufacturing a semiconductor device, comprising the steps of:
    forming a first trench having a predetermined depth at a predetermined location of a semiconductor substrate;
    configuring the first trench to isolate a p-MOSFET region and an n-MOSFET region;
    forming a nitride film over an inner side of the first trench;
    removing the nitride film from a bottom portion of the first trench and exposing the semiconductor substrate through the bottom portion while preserving the nitride film arranged at an upper portion of the first trench;
    after removing the nitride film from the bottom portion of the first trench, preserving the nitride film arranged at a first side wall of the first trench which first side wall is adjacent to the n-MOSFET region when viewed in cross section across a channel direction, and removing the nitride film from a second side wall of the first trench which second side wall is adjacent to the p-MOSFET when viewed in cross section across the channel direction; and
    performing thermal oxidation on the bottom portion and the second side wall, and forming a thermal oxide film extending from a lower end of the nitride film arranged at the first side wall and the upper end of the second side wall toward the semiconductor substrate.

12. The method as claimed in claim 11, further comprising the step of:
    etching a second trench from the bottom portion of the first trench;
    wherein the thermal oxidation is performed on a third side wall of the second trench which third side wall is adjacent to the n-MOSFET when viewed in cross section across the channel direction, a fourth side wall of the second trench which fourth side wall is adjacent to the p-MOSFET when viewed in cross section across the channel direction, and the second side wall of the first trench; and the thermal oxide film extending from the lower end of the nitride film toward the semiconductor substrate is arranged on the second side wall, the third side wall, and the fourth side wall.

13. The method as claimed in claim 11, wherein
the step of removing the nitride film includes removing the nitride film from a fifth side wall of the first trench which fifth side wall is adjacent to the p-MOSFET when viewed in cross section across a direction perpendicular to the channel direction.

14. The method as claimed in claim 13, wherein
the step of forming the thermal oxide film includes arranging the thermal oxide film over the fifth side wall that is adjacent to the p-MOSFET when viewed in cross section across the direction perpendicular to the channel direction.

15. The method as claimed in claim 13, wherein
the step of removing the nitride film involves using an n-well implant mask.

16. The method as claimed in claim 11, wherein
in the step of removing the nitride film, the nitride film is arranged to remain on a fifth side wall of the first trench which fifth side wall is adjacent to the p-MOSFET when viewed in cross section across a direction perpendicular to the channel direction.

17. The method as claimed in claim 16, wherein
the step of removing the nitride film involves using a combination of an n-well implant mask and an enlarged gate mask.

18. The method as claimed in claim 11, further comprising the step of:
performing resist exposure for well implantation after filling in the first trench with an implant material;
wherein an isolation width of a portion of the shallow trench isolation region at which portion the thermal oxide film is disposed is arranged to be greater than an exposure positioning deviation margin for the resist exposure step.

19. The method as claimed in claim 11, wherein
the thermal oxidation is realized at a temperature of 800-1000° C. through at least one of wet oxidation and dry oxidation.

* * * * *